United States Patent [19]

Tan

[11] Patent Number: 5,760,602
[45] Date of Patent: Jun. 2, 1998

[54] TIME MULTIPLEXING A PLURALITY OF CONFIGURATION SETTINGS OF A PROGRAMMABLE SWITCH ELEMENT IN A FPGA

[75] Inventor: Charles M. C. Tan, Santa Clara, Calif.

[73] Assignee: Hewlett-Packard Company, Palo Alto, Calif.

[21] Appl. No.: 587,687

[22] Filed: Jan. 17, 1996

[51] Int. Cl.[6] .......................... H03K 19/173; H03K 7/38
[52] U.S. Cl. ................................................ 326/38; 326/40
[58] Field of Search .................................. 326/38, 40, 41; 365/154, 156

[56] References Cited

U.S. PATENT DOCUMENTS

| | | |
|---|---|---|
| 3,987,286 | 10/1976 | Muehldorf. |
| 4,134,150 | 1/1979 | Shiga ............................ 365/154 |
| 4,623,989 | 11/1986 | Blake ............................ 365/156 |
| 5,214,327 | 5/1993 | Saeki et al. ..................... 326/38 |
| 5,426,378 | 6/1995 | Ong ................................ 326/38 |
| 5,444,393 | 8/1995 | Yoshimori et al. ............. 326/38 |

Primary Examiner—Edward P. Westin
Assistant Examiner—Richard Roseen
Attorney, Agent, or Firm—Brian R. Short

[57] ABSTRACT

A field programmable gate array (FPGA) system for time multiplexing a plurality of programmable configurations of the FPGA. The system includes a plurality of configuration memory cells which are loaded with configuration information. A time slice selector couples selected configuration memory cells to programmable switch elements that determine the configuration and function of the logic within the FPGA. A time slice controller determines which of the configuration memory cells the time slice selector couples to the programmable switch elements. The configuration memory cells may be implemented with half SRAM cells and the time slice selector may be implemented with P-channel transistors.

8 Claims, 6 Drawing Sheets

TIME MULTIPLEXING A PLURALITY OF CONFIGURATION SETTINGS OF A PROGRAMMABLE SWITCH ELEMENT IN A FPGA

FIELD OF INVENTION

This invention relates generally to field programmable gate arrays (FPGAs). In particular, a system for time multiplexing a plurality of programmable configurations of a FPGA.

BACKGROUND

FPGAs are revolutionizing the way digital electronics system designers implement logic. By radically reducing the development costs and the turnaround time for implementing thousands of gates of logic, FPGAs provide new capabilities that affect the semiconductor industry. FPGAs are changing the way digital systems will be designed in the future.

The use of programmable logic devices such as FPGAs has become widespread because of the flexibility provided by their re-programmability. A FPGA typically includes an array of programmable logic blocks that can be programmably interconnected to each other to provide the logic function desired by the digital electronics designer. Each of the programmable logic blocks may be individually programmed to perform any one of a number of different logic functions. The FPGA has configurable routing matrices for coupling the programmable logic blocks together according to a desired configuration. The FPGA also includes configuration memory cells. The configuration memory cells are coupled to the programmable logic blocks for specifying the function performed by each programmable logic block, and to the configurable routing matrices for specifying the coupling of the inputs and the outputs of the programmable logic blocks. Each programmable logic block is coupled to several configuration memory cells. Each configuration routing matrix is coupled to several configuration memory cells. By storing different values in the configuration memory cells, each programmable logic block may be individually programmed as to its function and coupling.

Each programmable logic block and configurable routing matrix comprise a plurality of programmable switch elements. The settings of the programmable switch elements define the logic function comprised within each programmable logic block and the coupling of the inputs and the outputs of the programmable logic blocks. The settings of the programmable switch elements are determined by the information stored within the configuration memory cells. Presently, each configuration memory cell corresponds to a particular programmable switch element. To modify the setting of a programmable switch element and thereby modify the logic defined by a logic block, the information within the configuration memory cells must be modified.

Generally, there are three types of programmable switch elements set by the configuration memory cells within a FPGA. The three types include cross point switches, lookup tables and multiplexers. For all three types of programmable switch elements, the values stored in the configuration memory cells determine the settings and configurations of the corresponding programmable switch elements.

Presently, FPGAs are limited by the fact that all of the information of the configuration memory must be loaded into the FPGA at the same time. Once loaded, the FPGA configuration as defined by the configuration memory is static until a new configuration is loaded. It is desirable to have FPGAs with configurations that are dynamic and which can be changed rapidly. The FPGA should be able to dynamically modify the configuration memory cells of the FPGA without any interaction with an external controller or microprocessor. It is also desirable to be able to rapidly modify any portion of the logic defined by the configuration memory of the FPGA while other portions of the logic remain static. With such a configuration, the speed benefits of calculations performed in hardware are realizable without being constrained by the typical lack of flexibility inherent in hardware implementations.

SUMMARY OF THE INVENTION

The present invention provides an apparatus and method for rapidly changing the configuration of a FPGA. While in operation, the configuration changes are obtained without any external controller required to load changes in the configuration into the configuration memory of the FPGA. The changes in the configuration of the FPGA can occur at a frequency determined by a user-provided clock. This architecture provides much greater flexibility in the implementation of electronic hardware than presently available.

An embodiment of this invention is a memory system for time multiplexing between a plurality of settings of a programmable switch element within a FPGA. The system includes a plurality of memory cells storing predetermined settings of the programmable switch element, a time slice selector receiving an output from each of the plurality of memory cells and selecting one of the outputs from the memory cells to drive the programmable switch element, and a time slice controller controlling the time slice selector and determining which of the plurality of memory cells is selected to drive the programmable switch element.

Another embodiment of the invention includes a plurality of programmable switch elements in which at least one of the programmable switch elements has a plurality of memory cells storing predetermined configurations of the programmable switch element.

Another embodiment of the invention includes a plurality of half static random access memory cell and a time slice selector. The time slice selector comprises a plurality of P-channel transistors in which a P-channel transistor corresponds with each of the plurality of half static random access memory cells. Each half static random access memory cell determines the setting of a corresponding programmable switch element when the corresponding P-channel transistor is turned on.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in a FPGA configuration memory architecture that allows the FPGA to be configured dynamically. That is, the configuration of the FPGA can be modified or updated very quickly without having to reload the configuration memory cells of the FPGA. The settings of the programmable switch elements of the FPGA are modified very quickly without requiring the interaction of an external controller. Other than an external clock, the reconfiguration of the programmable switch elements can be accomplished without any interaction from circuitry external to the FPGA. The dynamic configurations of the FPGA can be predetermined and characterized before loading the configuration memory cells. Once the configuration memory cells have been loaded, a progression of the settings of the programmable switch elements within the FPGA can be controlled by the circuitry on the FPGA. The invention allows all or a portion of the FPGA configuration to be modified as often as once per cycle of a user provided clock signal.

Figure 1:
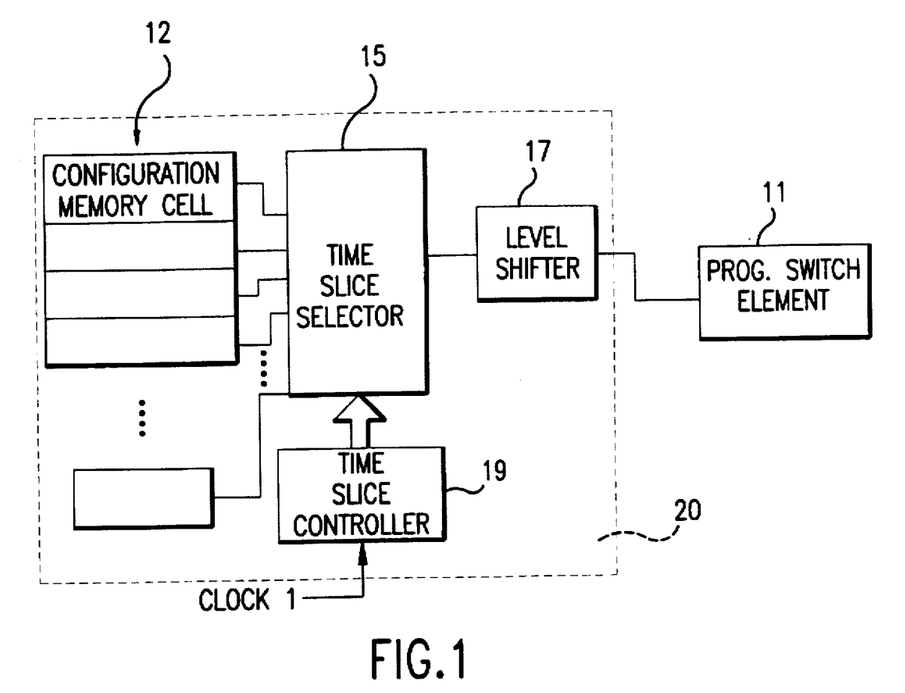
FIG. 1 is a block diagram of the FPGA configuration memory architecture of this invention.

FIG. 1 shows an embodiment of this invention. A plurality of configuration memory cells 12 store predetermined settings of a FPGA programmable switch element 11. Generally, only one of the plurality of configuration memory cells 12 determines the setting of the FPGA programmable switch element 11 at a time. A time slice selector 15 selects which memory cell of the plurality of configuration memory cells 12 determines the setting of the programmable switch element 11.

A signal level shift circuit 17 ensures that the signal level from the time slice selector is large enough to drive the programmable switch element 11 to the desired one of two states. Generally, the programmable switch element 11 is set to one of two states by turning a transistor within the programmable switch element 11 either "on" or "off". The signal level shift circuit 17 ensures that the voltage swing of the signal driving the programmable switch element is large enough to fully turn the transistor "on" or "off".

A time slice controller 19 determines the selection of the time slice selector 15. Therefore, the memory cell of the plurality of configuration memory cells 12 which drives the programmable switch element 11 at a particular point in time is controlled by the time slice controller 19.

The time slice controller 19 receives a clock signal clock 1 which can be used to clock the time slice controller 19 through a predetermined number of states. Each of the states of the time slice controller 19 can control the time slice selector 15 to electrically connect a different memory cell of the plurality of configuration memory cells 12 to the level shift circuitry 17 which in turn drives the programmable switch element 11. Therefore, the setting of the programmable switch element 11 can be modified as often as once per cycle of the clock signal clock 1.

The plurality of configuration cells 12, the time slice selector 15, the level shifter 17 and the time slice controller 19 all operate together to form a multiplex configuration cell 20.

FIG. 1 shows a FPGA configuration memory architecture for only one programmable switch element 11. FPGAs comprise a large number of programmable switch elements 11. Therefore, the FPGA configuration memory architecture shown in FIG. 1 can be duplicated for each of the programmable switch elements 11 within the FPGA. This architecture allows one, some, or all of the programmable switch elements 11 within the FPGA to be modified as often as once per cycle of the clock signal clock 1.

A FPGA comprises programmable logic blocks and configurable routing matrices which define the user logic within the FPGA. Each programmable logic block and configurable routing matrix comprise a plurality of programmable switch elements. The settings of the programmable switch elements define the logic function comprised within each programmable logic block and the coupling of the inputs and the outputs of the programmable logic blocks. This architecture allows one, some, or all of the programmable switch elements 11 within the FPGA to be modified as often as once per cycle of the clock signal clock1. Therefore, this architecture allows the user logic within the FPGA to be redefined as often as once per cycle of the clock signal clock1.

The dynamic control of each individual programmable switch elements makes this invention very powerful. The implementation of logic functions within a FPGA is defined by the settings of the programmable switch elements. Generally, a logic function is defined by the settings of a plurality of programmable switch elements. Modifying the setting of at least one programmable switch element of the plurality will redefine the logic function with the FPGA. Therefore, by having control over each of the plurality of programmable switch elements a vast number of possible logic functions can be implemented with each cycle of the clock signal clock1. Generally, the number of possible logic functions is limited by the number of configurable memory cells. The modification from one logic function to another is accomplished without an external controller reloading the configurable memory cells.

Figure 2:
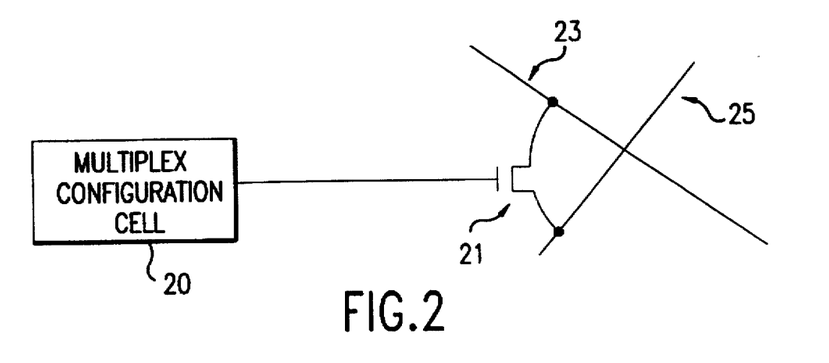
FIG. 2 shows a connection between a multiplex configurable memory cell and a cross point switch within a FPGA.

The simplest of the programmable switch elements is the cross point switch 21 as shown in FIG. 2. The cross point switch 21 is driven by a multiplex configuration cell 20 as defined by this invention. The multiplex configuration cell 20 comprises the functionality enclosed within the dashed box depicted in FIG. 1. A cross point switch 21 connects a first wire 23 and a second wire 25 within a FPGA if the cross point switch 21 is set to an "on" state. The cross point switch 21 typically comprises a N-channel transistor. Wires 23, 25 within the FPGA can be used for connecting the inputs or outputs of separate programmable logic blocks. That is, the wires 23, 25 can be part of the configurable routing matrices that specify the coupling of the inputs and outputs of the programmable logic blocks. As shown in FIG. 1, the cross point switch 21 connects two separate wires 23, 25 by turning the N-channel transistor of the cross point switch 21 "on". This is generally done by storing a high logic value in the multiplex configuration cell 20 that corresponds to the cross point switch 21. Turning "on" the N-channel transistor within the cross point switch 21 connects the first wire 23 and the second wire 25. The values to be stored in a plurality of configuration memory cells that correspond to a plurality of cross point switches is determined by knowing the required configuration of the programmable logic blocks and the routing matrices of the FPGA.

Figure 3:
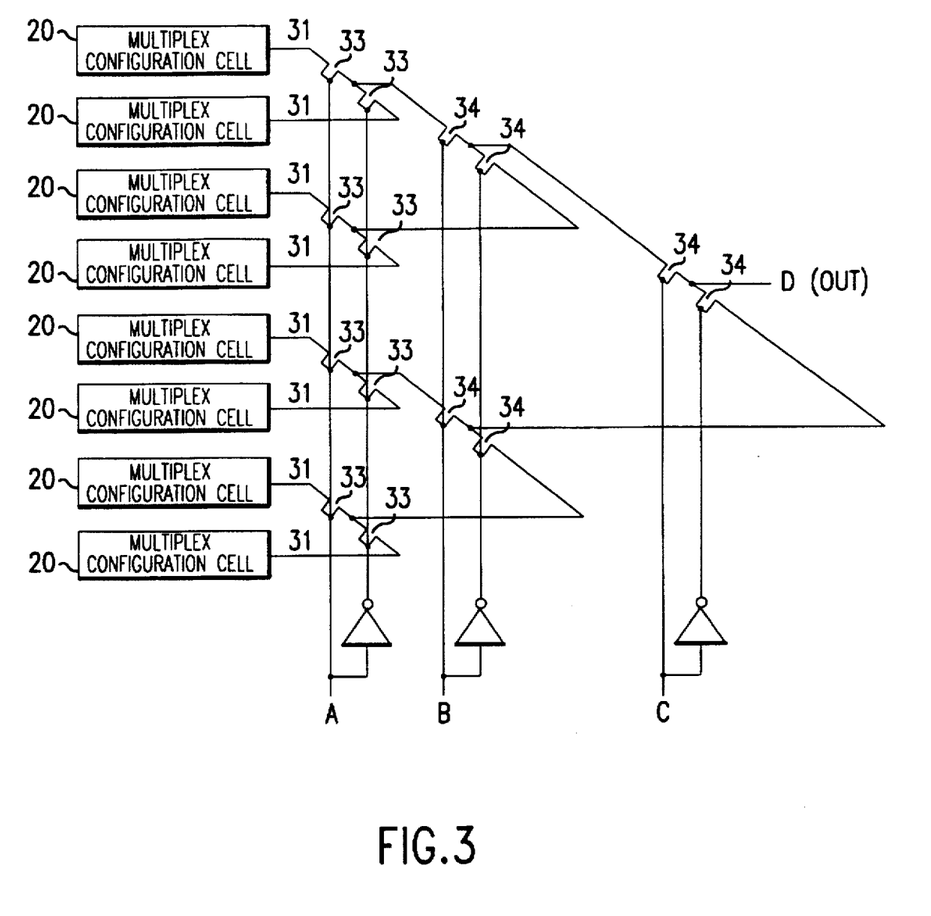
FIG. 3 shows a connection between a plurality multiplex configuration memory cells and a lookup table within a FPGA.

The second type of programmable switch element is a lookup table as shown in FIG. 3. A single lookup table requires a plurality of lookup table configuration inputs. Therefore, a plurality of programmable switch element inputs are required. FIG. 3 shows a three input lookup table which requires eight lookup table configuration inputs 31 and eight multiplex configuration cells 20. Lookup tables are also referred to as function generators and are a basic unit of a configurable logic block.

A lookup table implements combinational logic as a $2^n \times 1$ memory composed of multiplex configuration cells 20. The memory is used as a lookup table, addressed by n inputs. During a time slice, a lookup table can implement any of the $((2)^2)^n$ function of the inputs of the lookup table. When the FPGA is programmed, the memory is loaded with the bit pattern corresponding to the truth table of the function being implemented for each time slice. The lookup table of FIG. 3 has three inputs A, B, C. Therefore, during any time slice, 64 different functions may be configured with this lookup table.

As shown in FIG. 3, the multiplex configuration cells 20 set the bias on the drain of lookup table transistors 33. The inputs A, B, C to the lookup table determine which of the lookup table transistors 33, 34 are turned on. Therefore, the time dependent value of the lookup table configuration inputs stored in the multiplex configuration cells 20 determine the logical function of the lookup table comprised within a configurable logic block within the FPGA.

Figure 4:
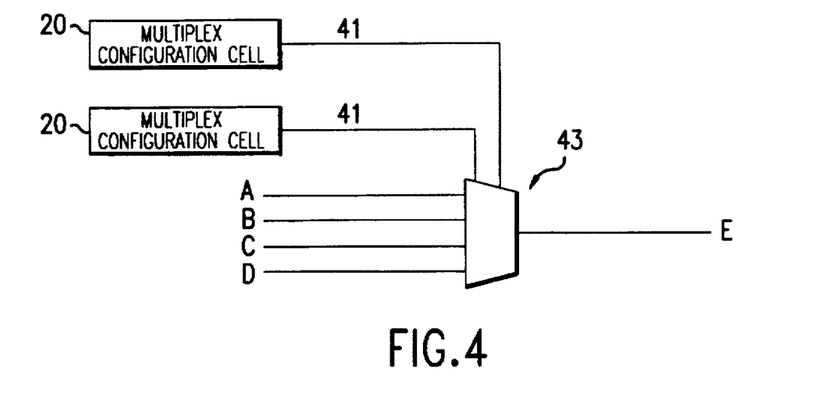
FIG. 4 shows a connection between a plurality multiplex configuration memory cells and a multiplexer within a FPGA.

The third type of programmable switch element is a multiplexer 43 as shown in FIG. 4. A multiplexer 43 is a special case, one-directional routing structure. The multiplexer 43 may be of any width (any number of inputs), with more multiplex configuration cells 20 required for wider multiplexers. The multiplexer 43 of FIG. 4 has four inputs A, B, C, D and requires two multiplexer control inputs 41. Switches with multiple inputs implemented with multiplexers provide a reduction in the number of multiplex configuration cells 20 required for controlling the switches. Therefore, multiplexers provide FPGA area savings for large switches. If the functionality of the multiplexer 43 shown in FIG. 4 had been implemented with switches, four multiplex configuration cells 20 would have been required. However, the multiplexer 43 depicted in FIG. 4 only requires two configuration cells 27. Thus, a reduction of two configuration memory cells is realized in this specific case by implementing the switch function with a multiplexer 43. The multiplexer structure within a FPGA receives a multiple of inputs. In each time slice, the associated multiplex configuration cells 20 determine which one of the multiple of inputs is switched to be connected to the output of the multiplexer. The greater the number of inputs connected to the multiplexer, the greater the number of multiplexer control inputs 41 and associated multiplex configuration cells 20 required.

Figure 5:
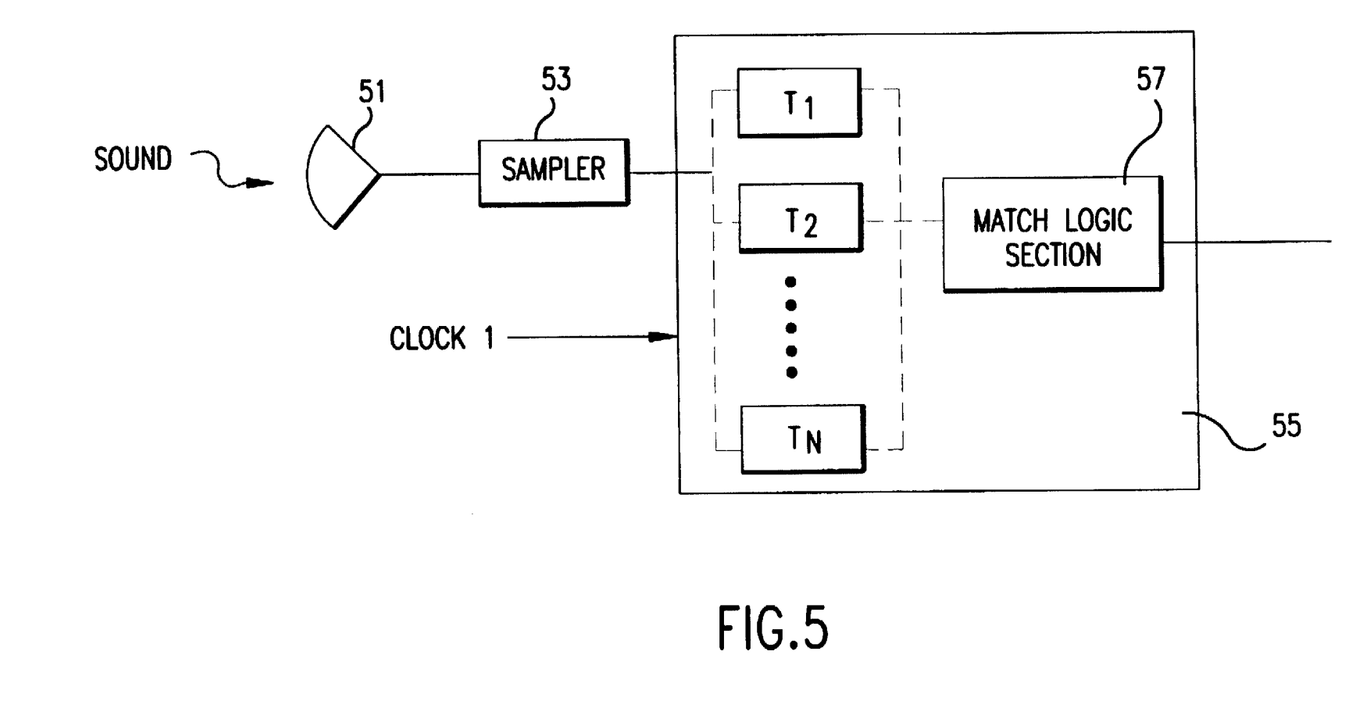
FIG. 5 show a block diagram in which this invention is used to recognize speech patterns.

An example of an application in which this invention can be used is voice or image recognition. This invention provides a fast and low cost solution. As shown in FIG. 5, a voice sound byte is received by a microphone 51 and is digitally sampled by a sampler 53 which generates a digital representation of the voice sound byte. To determine or recognize what the voice sound byte represents, the digital representation can be compared with a set of digital templates in which each digital logic template represents one of a plurality of known voice sound bytes.

This invention can be used to solve this problem by storing a plurality N of digital logic templates in the configuration memory of an FPGA 55 for N different known voice sound bytes. If M programmable switch elements are required to implement the digital logic template for a particular know voice sound byte, then M×N configuration memory cells are required to store all N digital logic templates. For each of the programmable switch elements, N configuration memory cells are loaded with the digital value required to implement the digital logic template for each of the N known voice sound bytes. With the digital logic templates loaded in the configuration memory cells, the templates can be stepped through one at a time with the clock signal clock1. The digital logic associated with the digital logic template that is the closest match can be set to output the largest digital value to a match logic section 57. By knowing which of the plurality of N configuration memory cells were setting the programmable switch elements at the point in time that the match logic section received the largest digital value, the digital logic template that matches the digital voice sound byte can be determined. Each digital logic template corresponds to a different voice sound byte. Therefore, the received voice sound byte can be recognized. The blocks T1, T2, . . . TN in FIG. 5 represent the digital logic associated with each of the plurality of N digital logic templates.

The template logic in this application is implemented in hardware. Therefore, the matching of the digital voice sound bytes with the template logic of each known digital logic template is accomplished much quicker than if the matching calculation were implemented in software. Therefore, calculating a voice sound byte match using an implementation of this invention is much quicker than a dedicated microprocessor calculating a voice sound byte match.

All of the templates can be implemented in an array of digital logic in an application specific integrated circuit (ASIC). However, with a large number of digital logic templates the ASIC can become very large and expensive. If the digital logic templates must be modified, then the ASIC must be replaced.

For a large template, present FPGA architectures require reloading the configuration cells of the FPGA for each digital logic template. Reloading the configuration memory cells of a presently existing FPGA for each of the template configurations, however, requires substantially more processing time due to the time required for a controller to load each of the template configurations.

Figure 6:
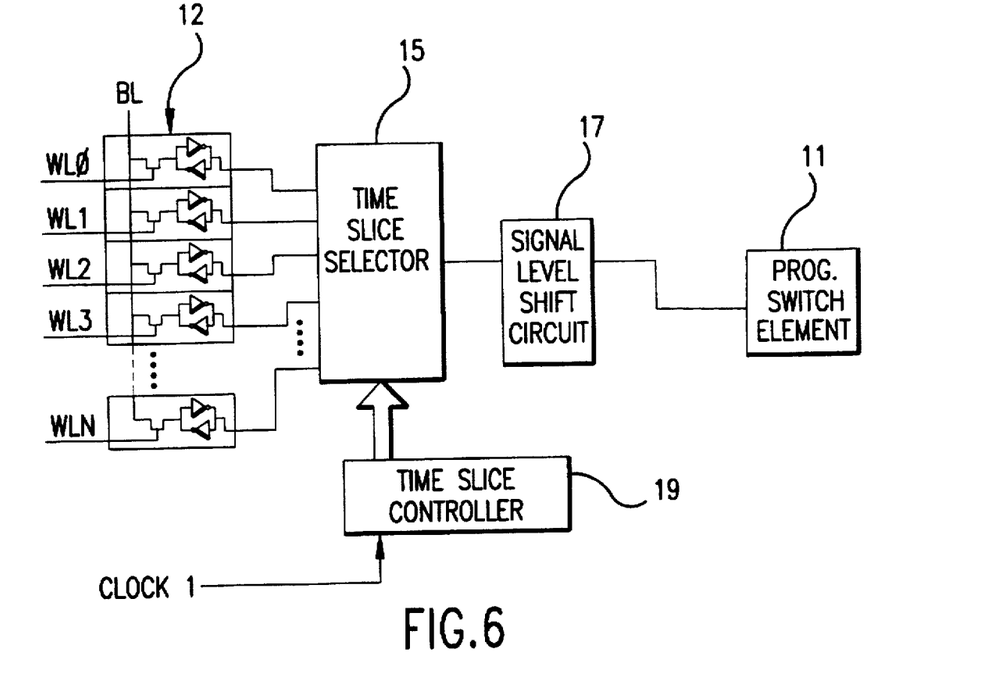
FIG. 6 is a block diagram showing an implementation of the configuration memory cells.
Figure 7A:
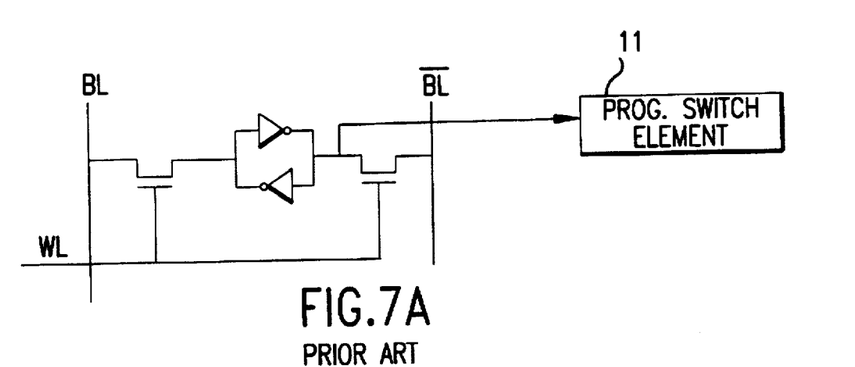
FIG. 7A shows a prior art full SRAM cell.
Figure 7B:
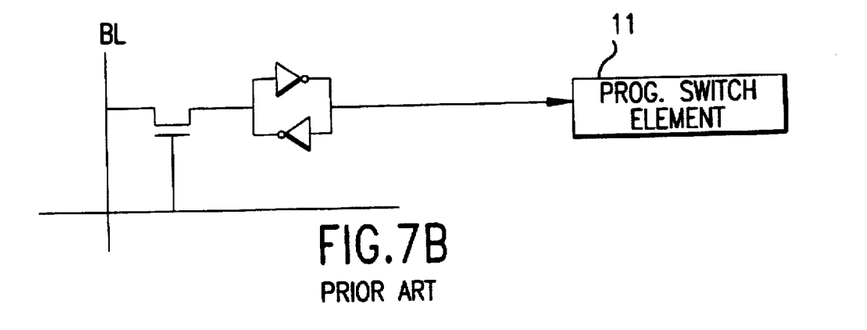
FIG. 7B shows a prior art half SRAM cell.

FIG. 6 shows an implementation of the plurality of configuration memory cells 12. In FIG. 6, the plurality of configuration memory cells 12 are implemented using half static random access memory (SRAM) cells. Half SRAM cells require much less space that standard SRAM cells. FIG. 7A shows a standard SRAM cell with two bitlines and two N-channel field effect transistors (FETs). FIG. 7B shows a half SRAM cell having only one bit line and only one N-channel FET. The standard SRAM cell requires more space and parts but is faster and more reliable. It is to be understood that SRAM is only one of the possible embodiments of the configuration memory cells 12.

Figure 8:
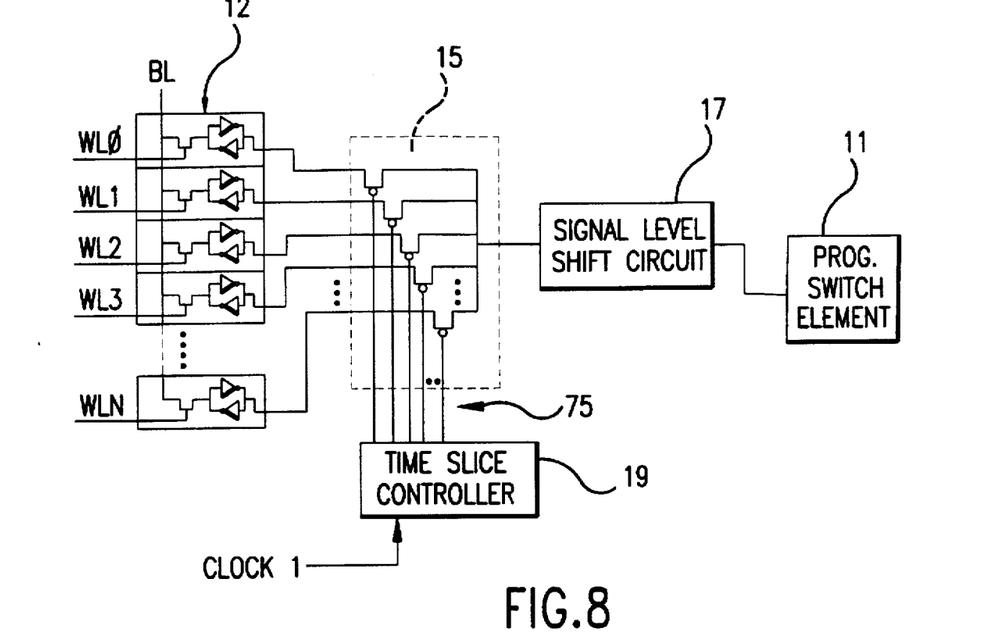
FIG. 8 shows an implementation of the configuration memory cells and the time slice selector.

FIG. 8 shows an implementation of the time slice selector. Here, the time slice selector 15 is implemented with a plurality of P-channel FETs. The gates of each P-channel FET are electrically connected to a different output of the time slice controller 19. The time slice controller turns on the selected P-channel FET. This electrically connects the signal level shift circuit 17 to the half SRAM memory cell associated with the P-channel FET.

Generally, P-channel FETs do not conduct as much current as N-channel FETs. It is for this reason that most circuit applications use N-channel FETs rather than P-channel FETs. In the present application, however) the lower level of current conducted by P-channel FETs makes the P-channel FETs more desirable. When connected to the output of a half SRAM cell, a P-channel FET is less likely than an N-channel FET to write over information stored in the half SRAM cells. Therefore, by configuring the time slice selector with P-channel FETs the configuration memory cells can be implemented with half SRAM cells which require less space and components than full SRAM cells.

Figure 10:
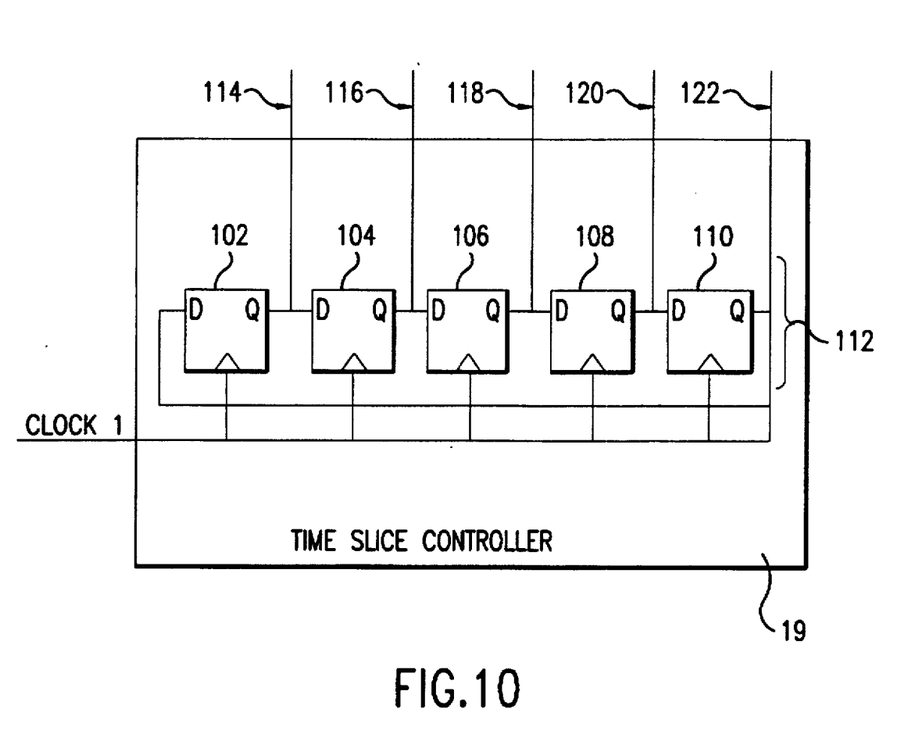
FIG. 10 shows the time slice selector implemented as a shift register.

The time slice controller 19 may be implemented with a shift register. Generally, only one configuration memory cell 12 sets the programmable switch element 11 at a time. Therefore, the time slice controller 19 will generally comprise a plurality of controller outputs 75. The particular P-channel transistor that corresponds to the individual cell of the configuration memory cells 12 which is to determine the setting of the programmable switch element 11 is selectively turned on by the controller outputs 75. Therefore, only one of the plurality of outputs 75 is active at any given point in time. If the time slice controller 19 is implemented with a shift register 112 as shown in FIG. 10, only one of a plurality of outputs 114, 116, 118, 120, 122 of the shift register 112 will be active at a time. The active output is shifted from one register to another register within a plurality of registers 102, 104, 106, 108, 11, within the shift register 112 of the time slice controller 19. An active output is an output that will turn on a P-channel transistor within the time slice selector 15. It is to be understood that this is only one embodiment and that other time slice controller embodiments are possible.

Figure 9:
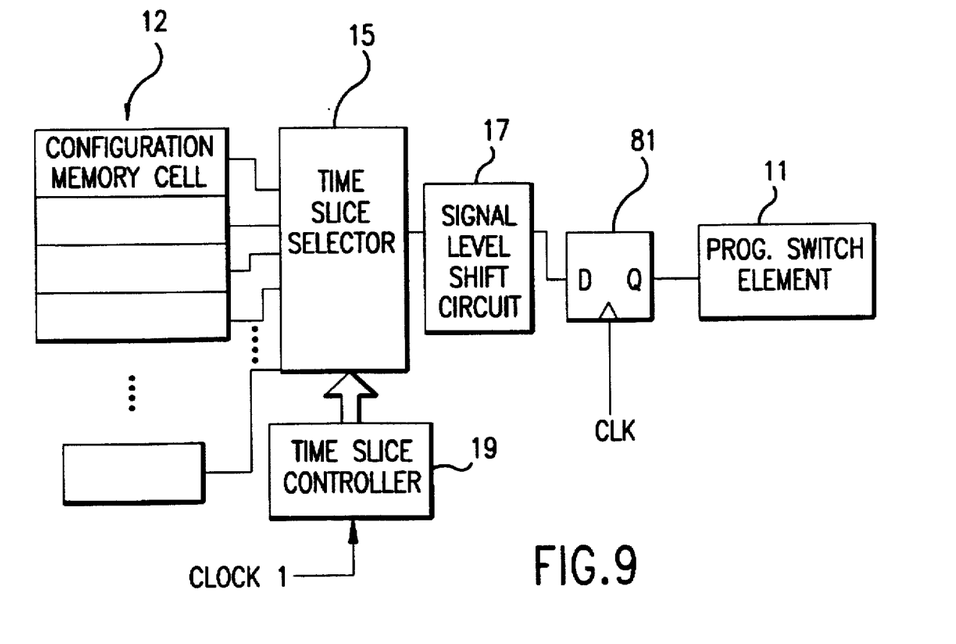
FIG. 9 is a block diagram showing the addition of a pipeline clock to the block diagram shown in FIG. 1.

FIG. 9 shows a pipeline synchronizer 81 inserted between the level shifter 17 and the programmable switch element 11. In FIG. 9, the pipeline synchronizer 81 is implemented with a D flip-flop. It is to be understood that this is only one embodiment, and other pipeline synchronizers 81 are possible. The D flip-flop latches the signal at the output of the level shifter upon receiving a clock edge of a synchronization clock. The Q output of the D flip-flop is electrically connected to the programmable switch element 11. Therefore, the control of the programmable switch element can be synchronized to the timing of other electronic circuitry within the FPGA.

There does not have to be any relationship between the synchronization clock CLK and the clock signal clock1. The clock signal clock1 clocks the time slice controller 19 through a plurality of states. The synchronization clock CLK ensures that desired programmable switch elements are static between synchronization clock cycles.

The functional blocks of this invention may be connected in many different ways. For example, a single time slice controller 19 may be connected to a plurality of time slice selectors 15 rather than just a single time slice selector 15. A single level shifter 17 may be electrically connected to a plurality of programmable switch elements 11 rather than just a single programmable switch element. A single time slice selector 15 may be electrically connected to a plurality of level shifters 17 rather than just a single level shifter 17.

Although specific embodiments of the invention have been described and illustrated, the invention is not to be limited to the specific forms or arrangements of parts so described and illustrated. The invention is limited only by the claims.

What is claimed is:

1. A memory system for time multiplexing between a plurality of settings of a programmable switch element within a FPGA, the system comprising:

a plurality of memory cells storing predetermined settings of the programmable switch element;

a time slice selector receiving an output from each of the plurality of memory cells and selecting one of the outputs from the memory cells to drive the programmable switch element; and a time slice controller controlling the time slice selector and determining which of the plurality of memory cells is selected to drive the programmable switch element; wherein a plurality of the memory cells comprises a half static random access memory cell and the time slice selector comprises a plurality of P-channel transistors wherein a P-channel transistor corresponds with each of the plurality of half static random access memory cells and wherein a half static random access memory cell determines the setting of a corresponding programmable switch element when the corresponding P-channel transistor is turned on; and wherein the time slice selector comprises a shift register.

2. A memory system for time multiplexing between a plurality of settings of a programmable switch element within a FPGA, the system comprising:

a plurality of memory cells storing predetermined settings of the programmable switch element;

a time slice selector receiving an output from each of the plurality of memory cells and selecting one of the outputs from the memory cells to drive the programmable switch element; and a time slice controller controlling the time slice selector and determining which of the plurality of memory cells is selected to drive the programmable switch element; wherein a pipeline synchronizer allows the settings of the programmable switch element to be synchronized to a synchronization clock.

3. A memory system for time multiplexing between a plurality of settings of a programmable switch element within a FPGA, the system comprising:

a plurality of memory cells storing predetermined settings of the programmable switch element;

a time slice selector receiving an output from each of the plurality of memory cells and selecting one of the outputs from the memory cells to drive the programmable switch element; and a time slice controller controlling the time slice selector and determining which of the plurality of memory cells is selected to drive the programmable switch element; wherein a plurality of switch elements determine the configuration of a voice recognition template and a plurality of digital voice recognition templates are stored in the plurality of memory cells corresponding with each of the plurality of switch elements.

4. A memory system for time multiplexing between a plurality of settings of a programmable switch element within a FPGA, the system comprising:

a plurality of memory cells storing predetermined settings of the programmable switch element;

a time slice selector receiving an output from each of the plurality of memory cells and selecting one of the outputs from the memory cells to drive the programmable switch element; and a time slice controller controlling the time slice selector and determining which of the plurality of memory cells is selected to drive the programmable switch element; wherein a plurality of switch elements determine the configuration of an image recognition template and a plurality of digital image recognition templates are stored in the plurality of memory cells corresponding with each of the plurality of switch elements.

5. A memory system for time multiplexing between a plurality of settings of a programmable switch element within a FPGA, the system comprising:

a plurality of memory cells storing predetermined settings of the programmable switch element;

a time slice selector receiving an output from each of the plurality of memory cells and selecting one of the outputs from the memory cells to drive the programmable switch element; and a time slice controller controlling the time slice selector and determining which of the plurality of memory cells is selected to drive the programmable switch element; wherein a plurality of the memory cells comprises a half static random access memory cell and the time slice selector comprises a plurality of P-channel transistors wherein a P-channel transistor corresponds with each of the plurality of half static random access memory cells and wherein a half static random access memory cell determines the setting of a corresponding programmable switch element when the corresponding P-channel transistor is turned on; and wherein a level shifter ensures that the programmable switch element is fully set to one of two states.

6. The memory system as recited in claim 5, wherein the programmable switch element is a look-up table input.

7. The memory system as recited in claim 5, wherein the programmable switch element is a multiplexer control input.

8. The memory system as recited in claim 5, wherein the time slice controller is connected to a user provided clock which clocks the time slice controller through a predetermined number of states.

* * * * *